(12) United States Patent
Odaohhara

(10) Patent No.: US 6,664,764 B1
(45) Date of Patent: Dec. 16, 2003

(54) APPARATUS AND METHOD FOR DETECTING A BATTERY USE STATE AND MITIGATING BATTERY DETERIORATION

(75) Inventor: Shigefumi Odaohhara, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/834,803

(22) Filed: Apr. 13, 2001

(30) Foreign Application Priority Data

May 11, 2000 (JP) ........................................ 2000-138214

(51) Int. Cl.[7] .......................... H02J 7/00; G01N 27/416
(52) U.S. Cl. ........................................ 320/132; 324/426
(58) Field of Search .................................. 320/106, 132, 320/134; 324/426, 427, 430, 433, 434; 702/63, 108, 117, 182, 57, 81

(56) References Cited

U.S. PATENT DOCUMENTS 5,561,362 A * 10/1996 Kawamura et al. ......... 320/134
5,691,078 A * 11/1997 Kozaki et al. ....... 320/DIG. 21
5,783,322 A * 7/1998 Nagai et al. ................. 320/134
6,181,103 B1 * 1/2001 Chen ........................... 320/106

FOREIGN PATENT DOCUMENTS

JP 08033220 * 2/1996

OTHER PUBLICATIONS

A.W. Swagger, Mar. 2, 1995, EDN Access, Smart battery Technology: power managements's missing link, Archived Article, pp. 1–14.*
JAPUPA H8–33220 to Sony.

* cited by examiner

Primary Examiner—Pia Tibbits
(74) Attorney, Agent, or Firm—J. Bruce Schelkopf

(57) ABSTRACT

A power supply apparatus is described in which one can suppress deterioration thereof when in preservation at a relatively low cost and with high reliability, obtain a charge control apparatus and charge control method which can suppress the deterioration thereof when in preservation of the power supply apparatus at a relatively low cost and with high reliability, and obtain a computer and an electric automobile suitable to which the charge control method can be applied.

16 Claims, 11 Drawing Sheets

Figure 4

| Manufacturer name | IBM |
|---|---|
| Shipping date | 2000/08/20 |
| Serial number | 123456 |
| Bar code number | 987654 |
| Battery name | Smart battery |
| Battery type | Lithium-ion |
| Rating capacity | 48000mAH |
| Rating voltage | 10800mV |
| Charge current | 2600mA |
| Remaining capacity | 4800mAH |

Figure 6
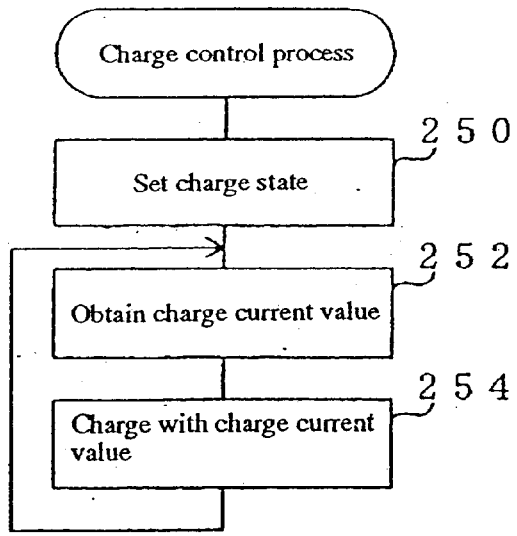
[Figure 7]
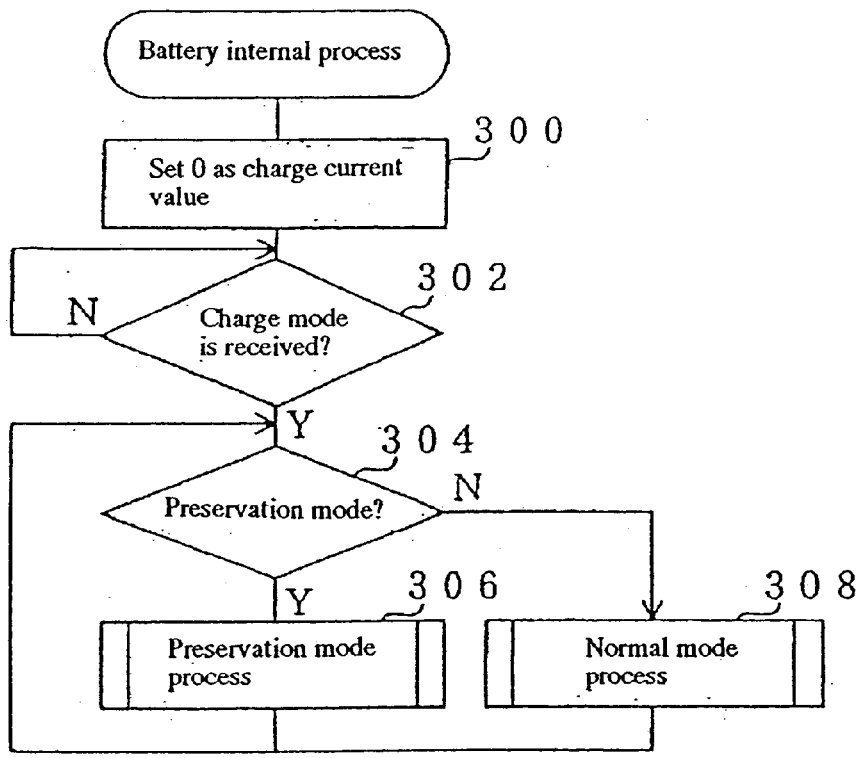

APPARATUS AND METHOD FOR DETECTING A BATTERY USE STATE AND MITIGATING BATTERY DETERIORATION

FIELD OF THE INVENTION

The present invention relates to a power supply apparatus, a charge control apparatus, a charge control method, a computer, and an electric automobile; more particularly the invention is directed to a power supply apparatus equipped with a rechargeable battery, a charge control apparatus for controlling the charging of the battery provided in the power supply apparatus, a charge control method, a computer to which the charge control method is applied, and an electric automobile equipped with the power supply apparatus and the charge control apparatus.

BACKGROUND OF THE INVENTION

It is well known that mobile computing has become evermore pervasive, and, as a result, portable personal computers (hereinafter referred to as portable PCs) now have various sizes and diverse functions. Examples of these pervasive portable PCs include notebook PCs, palmtop PCs, and PDAs (Personal Data Assistants).

A portable PC typically includes a battery in the main body thereof. Due to the presence of a stored battery, storage battery or battery component (hereinafter referred to a stored battery) with a portable PC, even in an environment in which no commercial power supply is available, for instance, in a mobile environment such as a train, the user can use and operate the portable PC. Typically, in conjunction with the stored battery, a secondary battery is usually also employed which can be used repeatedly by charging.

With regard to the secondary battery, which can be used in computers such as the portable PC, various household electric appliances, and electric automobiles, it is known that an intelligent version of the battery can also be used wherein the intelligent battery may typically have a built-in electric circuit. In accordance with such a battery, the remaining capacity of the battery can be informed (e.g. by display) to the outside or external portion of the battery with a relatively high degree of accuracy due to the built-in electric circuit of the battery. Accordingly, for instance, by using the intelligent battery as the secondary battery for a portable PC, the user can anticipate in advance of the actual exhaustion of the battery as to how much of the remaining capacity is left during the use of the portable PC in an environment that does not allow the use of a commercial power source, so as to avoid a sudden shutdown of the PC during the use.

On the other hand, when both the secondary battery, as mentioned above, and an AC adapter for converting power by a commercial power source to power suitable for the side to be supplied with power are concurrently connected, it is usually designed to carry out the charging so that the battery capacity of the secondary battery always maintains 100%. However, there can be a problem that the chemical reaction in the battery accelerates and the secondary battery deteriorates in a shorter period of time than normal when the battery capacity is reduced by self-discharge where the charge is always maintained at 100% by active recharging.

Further, if the secondary battery is removed from the side to be supplied with power and preserved for a long period, self-discharging can occur, and as a result, it may be preserved in a completely discharged state; in this situation, a problem may occur in which the chemical reaction in the battery accelerates causing the secondary battery to deteriorate in a shorter period of time.

That is, generally a secondary battery has a battery capacity range suitable for preservation according to the type or the like of the secondary battery, and preservation in the battery capacity range is recommended by each secondary battery maker, though the progress of deterioration is accelerated if the secondary battery is preserved with a battery capacity being outside the range.

One technique which attempts to overcome the above problem is described in Published Unexamined Patent Application No. 8-33220, which is incorporated herein by reference.

In accordance with that technique, once the type of a removably structured secondary battery is determined, the charging and discharging of the battery are controlled to provide a capacity suitable for preservation of the secondary battery thereby suppressing the overall deterioration of the secondary battery in the preservation.

However, the technique described in the above-mentioned Published Unexamined Patent Application No. 8-33220 is limited in that it requires a means for determining the type of the secondary battery, whereby this means likely pushes the overall cost of the resulting component upwards. This additional means and additional cost are unnecessary and undesired results in attempting to overcome problems in the field, such as that described above.

Further, in the technique described in the above Published Unexamined Patent Application No. 8-33220, if the mode automatically switches to a preservation mode, the period of idle state of the secondary battery is measured by a timer that is provided external to the secondary battery; the preservation mode is entered when the duration of idle state reaches a predetermined period. However, when this technique is applied to an apparatus such as a portable PC that selectively uses the power of either the commercial power source or the secondary battery, and, in addition, the above timer is included in the apparatus, then the timer is reset if the AC adapter provided to supply commercial power to the apparatus is pulled out, so the mode cannot switch to the preservation mode with accurate timing. This result is also undesired to overcome the problems in the field.

SUMMARY OF THE INVENTION

The present invention is directed to a power supply apparatus in which deterioration of the power supply apparatus during its preservation can be suppressed at low cost while providing reliability. The present invention is also directed to providing a charge control apparatus and charge control method which can suppress the deterioration of the power supply apparatus during the preservation of the power supply apparatus at low cost while providing reliability. The present invention is further directed to providing a computer and an electric automobile to which the charge control method of the present invention can be applied.

The power supply apparatus according to the present invention is provided as an intelligent battery with a rechargeable battery and charge demanding means. The above rechargeable battery is inclusive, inter alia, of all secondary batteries such as lithium-ion battery, nickel-hydrogen battery, nickel-cadmium battery, and lithium-polymer battery. Further, the charge demanding means is inclusive of but not limited to an electric circuit such as a CPU (Central Processing Unit).

It In one aspect of the present invention for a power supply apparatus, a charge demand is output when the remaining capacity of the battery is detected, by the charge demanding means, and the remaining capacity becomes lower than a predetermined preservation capacity value or range which is suitable for preserving the battery.

The remaining battery capacity may be detected, for instance, by previously determining and storing the full-charge capacity, and then subtracting the discharge amount since the time of full-charge from the full-charge capacity value. Further, in relation to the remaining battery capacity, the voltage value of the battery which often increases or decreases depending on the remaining capacity, may be utilized.

Further, in an aspect of the present invention, the power supply apparatus is not connected to a load to,be supplied with power from the battery (i.e., the invention is of the form in which power is not supplied to the load though the apparatus is connected to the load, etc.). Furthermore, the preservation capacity is defined to include a single capacity value, as well as a capacity range having an upper limit capacity value and a lower limit capacity value. A charge demand is output when the remaining battery capacity becomes lower than the lower limit capacity value of the preservation capacity range.

Since the characteristics of a battery provided in the power supply apparatus may vary differently depending on the differences in technology, maker, and material, the preservation capacity is directly dependent on the specific battery. Thus, in the power supply apparatus according to the present invention, with a predetermined preservation capacity suitable for preserving the battery as a standard, a charge demand is output when the remaining battery capacity becomes lower than the preservation capacity.

As described above, in the power supply apparatus according to the present invention, the remaining capacity of the battery may be detected, and a charge demand is output when the remaining capacity becomes lower than the predetermined preservation capacity suitable for battery preservation. Since the power supply apparatus itself determines the timing of charging (recharging) for maintaining the preservation capacity according to the battery, the battery can be maintained at the preservation capacity suitable for preserving the battery by only externally charging the battery when the charge demand is output, without providing any means for determining the battery type, so the battery deterioration in preservation can be suppressed at low cost.

Further, in another aspect of the present invention, the charge demanding means may include output means which outputs information indicating a charge current value for the battery as the charge demand. In this case, by the output means, information indicating a charge current value for the battery is output as the charge demand. In this aspect, since it is only needed to zero the charge current value if no charge demand is output, the output/non-output of charge demand can be readily switched and a proper charge current value according to the battery can be output to the outside, so proper charging to the battery can be realized.

Furthermore, in another aspect, the charge demanding means may further include a detecting means for detecting the use state of the battery and measuring means for measuring the duration of idle state of the battery, so that the charge demand is output when the remaining capacity is lower than the preservation capacity and the idle state is equal to or longer than a predetermined time. In this case, the use state of the battery is detected by the detecting means, and the duration of idle state of the battery is measured by the measuring means based on the detected result, and the charge demand is output when the remaining capacity is lower than the preservation capacity and the idle state is equal to or longer than the predetermined time.

In addition, the use state of the battery that is detected by the detecting means indicates a state in which power is supplied to a load, and the idle state indicates a state in which no power is supplied to the load. And, determination as to whether or not the battery is in the idle state can be made, for instance, by detecting the output current from the battery, and deciding that it is in the idle state if the output current is smaller than an output current that can be considered supplying power to the load.

In accordance with the power supply apparatus in this aspect, the charge demand for the remaining battery capacity being lower than the preservation capacity is output only when the idle state becomes equal to or longer than the predetermined time, and the power supply apparatus itself automatically makes the switch to a mode for maintaining the battery at a remaining capacity suitable for preservation (corresponding to the above-mentioned preservation mode), so deterioration in the preservation can reliably be suppressed even if the AC adapter provided for supplying commercial power to the load is pulled out.

Moreover, in still another aspect, the charge demanding means may further include a setting means for making a setting enabling a charge demand to be output, so that the charge demand is output when the remaining capacity is lower than the preservation capacity and the setting is made by the setting means to enable the charge demand to be output.

In this aspect, since a configuration is provided in which the setting can be externally made by the setting means to enable the charge demand to be output, the power supply apparatus can be switched to the preservation mode if the user sets a switching to the preservation mode by a utility program or the like.

In another aspect of the present invention, the charge control apparatus and charge control method control the charging of the battery provided in the power supply apparatus, and control the battery charge operation by a charger in response to a charge demand from the power supply apparatus.

In accordance with the charge control apparatus and charge control method according to the present invention, since the battery charge operation by the charger is controlled in response to the charge demand that is output from the power supply apparatus according to the present invention, the battery of the power supply apparatus can be maintained at a preservation capacity suitable for preserving the battery without providing means for determining the battery type, so the battery deterioration in the preservation can be suppressed at low cost.

Furthermore, in another aspect, the charge control apparatus and charge control method according to the present invention may read the remaining battery capacity by the charge demanding means according to the present invention, and if the read remaining capacity exceeds the preservation capacity, the battery is discharged to the preservation capacity before the charge operation.

This allows the remaining battery capacity to be rapidly reduced to the preservation capacity, and switching to the preservation mode can be made in a short time.

In another aspect of the present invention, the application of the charge control method to a computer including a CPU, a memory, a display, an input device, which are interconnected by a bus, and the power supply apparatus can be implemented by making the above memory a machine-readable recording medium having recorded thereon a program that controls the charging of the power supply apparatus according to the charge control method of the present invention. In accordance with this computer, since the battery charge operation by the charger is controlled in response to a charge demand that is output from the power supply apparatus according to the present invention, the battery of the power supply apparatus can be maintained at a preservation capacity suitable for preserving the battery without providing means for determining the battery type, so the battery deterioration in the preservation can be suppressed at low cost.

Further, the application of the charge control method according to the present invention to a computer including a CPU, a memory, a display, an input device, a network connection device, which are interconnected by a bus, and the power supply apparatus according to the present invention can be implemented by making the external storage of a server (referenced as 41 in FIG. 1) computer arranged on a network, to which the network connection device is connected, a machine-readable recording medium having recorded thereon a program that controls the charging of the power supply apparatus according to the charge control method of the present invention. In accordance with this computer, since the battery charge operation by the charger is controlled in response to a charge demand that is output from the power supply apparatus according to the present invention, the battery of the power supply apparatus can be maintained at a preservation capacity suitable for preserving the battery without providing means for determining the battery type, so the battery deterioration in the preservation can be suppressed at low cost.

Further, by providing at least one of the power supply apparatus and the charge control apparatus according to the present invention in an electric automobile (depicted as 900 in FIG. 12), the effect similar to the charge control apparatus according to tie present invention can also be produced for an electric mobile device such as tin electric automobile.

BRIEF DESCRIPTION OF THE DRAWINGS

FIG. 4 is a diagrammatical view showing an example of memory contents of a memory according to an embodiment of the present invention;

FIG. 6 is a flowchart showing a flow of a charge control process executed in the embedded controller of the computer system according to an embodiment of the present invention;

FIG. 7 is a flowchart showing a flow of a battery internal process executed in the CPU of the main battery and second battery according to an embodiment of the present invention;

DETAILED DESCRIPTION OF THE INVENTION

Figure 1:
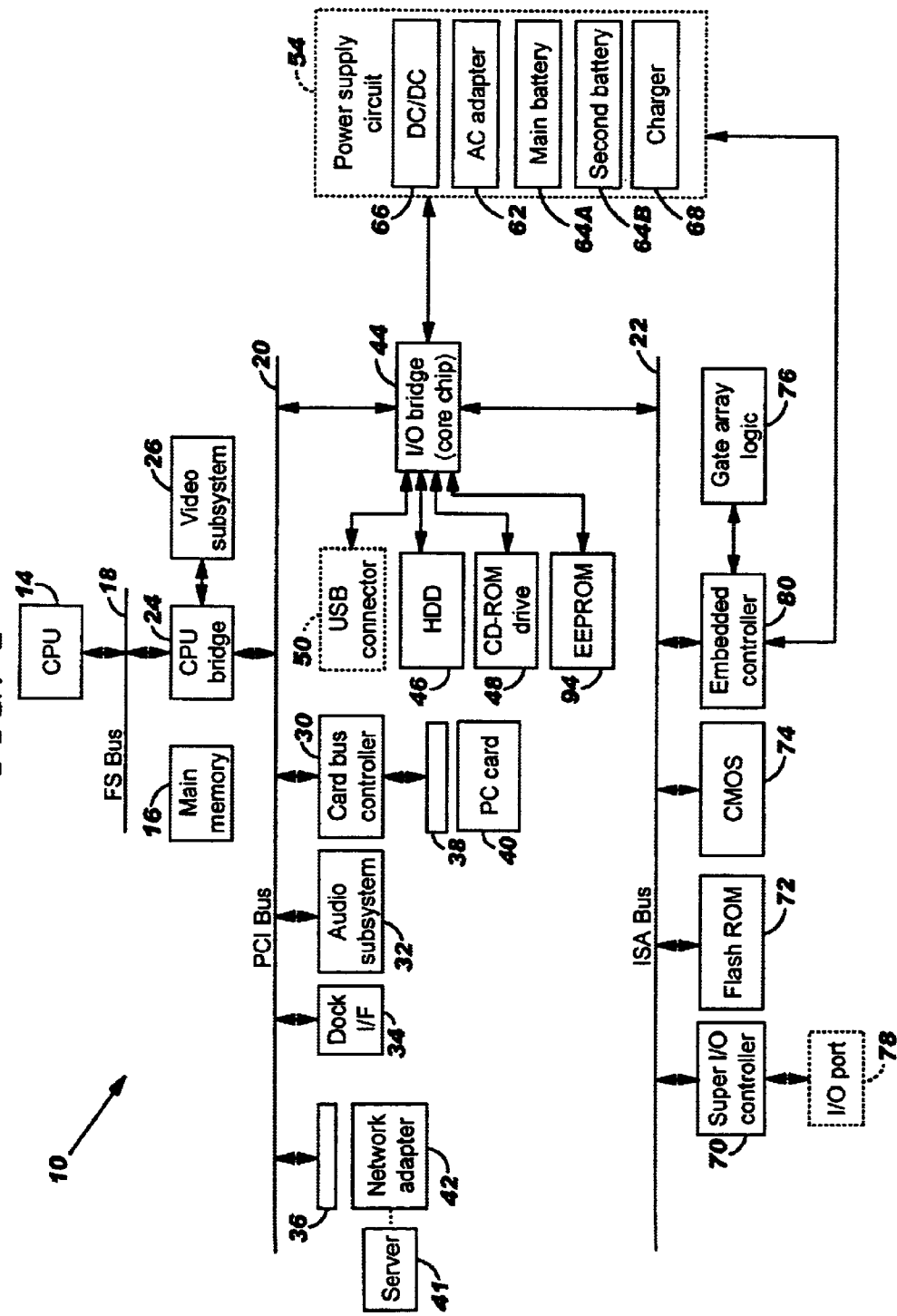
FIG. 1 is a block diagram showing a schematic configuration of a computer system according to an embodiment of the present invention.

FIG. 1 diagrammatically shows the hardware configuration for each subsystem of a computer system 10 comprising a typical personal computer (PC) to which the present invention is applied. An example of PC to which the present invention is applied is a notebook PC 12 (refer to FIG. 2), which is based on the OADG (PC Open Architecture Developer's Group) specification and has installed thereon "Windows 98 or NT" of Microsoft Corp., U.S.A. or "OS/2" of IBM Corp., U.S.A. as the operating system. Each part of the computer system 10 will be described below.

A CPU 14, which is often referred to as the "brain" of the whole computer system 10, executes various programs under control of the OS (Operating System). The CPU 14 may be a CPU chip "Pentium" made by Intel Corp., U.S.A., or CPUs made by other companies such as AMD, or "Power PC" made by IBM Corp.

The CPU 14 is interconnected to the various hardware structural elements to be described later, through three levels of buses: an FS (Front Side) bus 18 as a processor direct connection bus which is directly connected to the external pin of the CPU itself, a PCI bus (Peripheral Component Interconnect) bus 20 for high-speed I/O devices, and an ISA (Industry Standard Architecture) bus 22 for low-speed I/O devices.

The FS bus 18 and the PCI bus 20 are interconnected by a CPU bridge (host-PCI bridge) 24, which is usually called a memory/PCI control chip.

A main memory 16 is a writable memory, which is used as an area to which the execution programs of the CPU 14 are written, or a work area to which the processing data of the execution programs is written.

The above-mentioned execution programs include but are not limited to OS such as Windows 98, various device drivers for hardware-operating peripheral devices, application programs directed to specific applications, and firmware stored in a flash ROM 72, such as BIOS (Basic Input/Output system: a program for controlling the input/output operations of the respective hardware such as a keyboard and a floppy disk drive).

The PCI bus 20 is a bus of the type enabling relatively high speed data transfer, to which PCI devices driven at a relatively high speed, such as a card bus controller 30, are connected.

Figure 2:
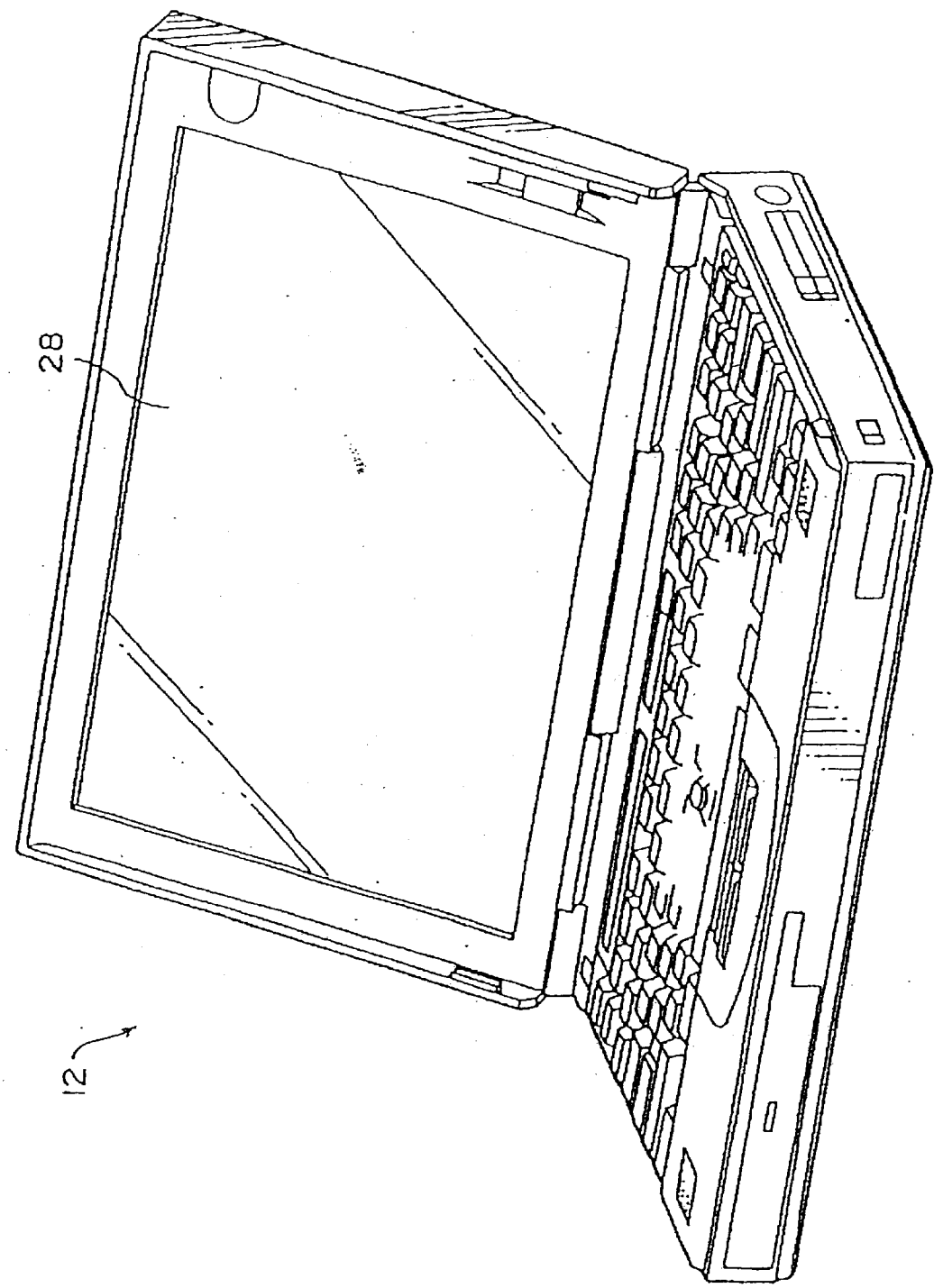
FIG. 2 is a perspective view showing an external appearance of a notebook PC.

A video subsystem 26 is a subsystem for implementing functions related to video, and it includes a video controller, which actually processes the drawing instruction from the CPU 14 and once writes the processed drawing information to a video memory (VRAM), and reads the drawing information from the VRAM and outputs it as drawing data to a liquid crystal display (LCD) 28 (refer to FIG. 2).

Further, to the PCI bus 20, the card bus controller 30, an audio subsystem 32, a docking station interface (Dock I/F) 34, and a mini PCI slot are connected. The card bus controller 30 is a special-purpose controller for directly connecting the bus signal of the PCI bus 20 to the interface connector (card bus) of a card bus slot 38. Loaded in the card bus slot 38 is a PC card 40, which is disposed, for instance, in the wall surface of the PC 12 main body and based on a specification defined by PCMCIA (Personal Computer Memory Card International Association)/JEIDA (Japan Electronic Industry Development Association) (for instance, "PC Card Standard 95").

The Dock I/F 34 is hardware for connecting the PC 12 and a docking station (not shown). Further, to the mini PCI slot 36, for instance, a network adapter 42 is connected for connecting the computer system 10 to a network (for instance, LAN).

The PCI bus 20 and the ISA bus 22 are interconnected by an I/O bridge 44. The I/O bridge 44 includes the bridge function between the PCI bus 20 and the ISA bus 22, an IDE (Integrated Drive Electronics) interface function, and a USB (Universal Serial Bus) function, and also includes a real time clock (RTC), and whereas for example, a device (core chip) named PIIX4, made by Intel Corporation, may be used. To the IDE interface implemented by the IDE interface function, an IDE hard disk drive (HDD) 46 as well as an IDE CD-ROM drive 48 are connected by ATAPI (At Attachment Packet Interface).

Further, a USB port is provided in the I/O bridge 44, and the USB port is connected to a USB connector 50 provided, for instance, in the wall surface of the PC 12.

Further, connected to the I/O bridge 44 is an EEPROM 94 through the SM bus. The EEPROM 94 is a memory for holding information such as a password, supervisor password, which are registered by the user, and a product serial number, which is nonvolatile and electrically writable for the memory contents.

Further, the I/O bridge 44 is connected to a power supply circuit 54. The power supply circuit 54 includes an AC adapter 62, a charger 68 for charging a main battery 64A configured as an intelligent battery or a second battery 64B, and circuits such as a DC/DC converter 66 for generating d.c. constant voltages of approximately 5 V and 3.3 V which are used in the computer system 10.

The main battery 64A and the second battery 64B in this embodiment is configured as the one based on the smart battery specification. The smart battery specification is a specification jointly developed by Intel Corp., U.S.A. and Duracel Corp., U.S.A., and it enables the remaining capacity of a battery to be informed to the outside with high precision by a built-in electronic circuit. Further, in the smart battery specification, various kinds of information such as maker, serial number, and rating capacity are typically stored in an internally provided memory, so the user can get the various information stored in the memory by various commands in compliance with the smart battery specification.

On the other hand, in the core chip forming the I/O bridge 44, there is provided an internal register for managing the power state of the computer system 10, and a logic (state machine) for performing the management of the power state of the computer system 10, including the operation of the internal register.

The above-mentioned logic sends and receives various signals between the power supply circuit 54, and by the sending and receiving of signals, it recognizes the actual power supply from the power supply circuit 54 to the computer system 10, and the power supply circuit 54 controls the power supply to the computer system 10 according to the instructions from the above logic.

The ISA bus 22 is a bus whose data transfer speed is lower than the PCI bus 20, and it is used to connect a super I/O controller 70, a flash ROM 72 formed from EEPROM or the like, a CMOS 74, and an embedded controller 80 connected to a gate array logic 76 as well as peripheral devices (all not shown) such as a keyboard/mouse controller, which operate at a relatively low speed.

An 110 port 78 is connected to the I/O controller 70. The super I/O controller 70 controls the driving of a floppy disk drive (FDD), the input/output of parallel data through a parallel port, the input/output of serial data through a serial port.

The flash ROM 72 is a memory to hold a program such as BIOS, and it is nonvolatile and the memory contents of it is electrically rewritable. Further, the CMOS 74 is formed by connecting a semiconductor memory to a backup power supply, and functions as a nonvolatile and fast memory means.

The embedded controller 80 controls a keyboard, not shown, and shares part of the power management function in cooperation with the array logic 76 by a power management controller included in it.

Figure 3:
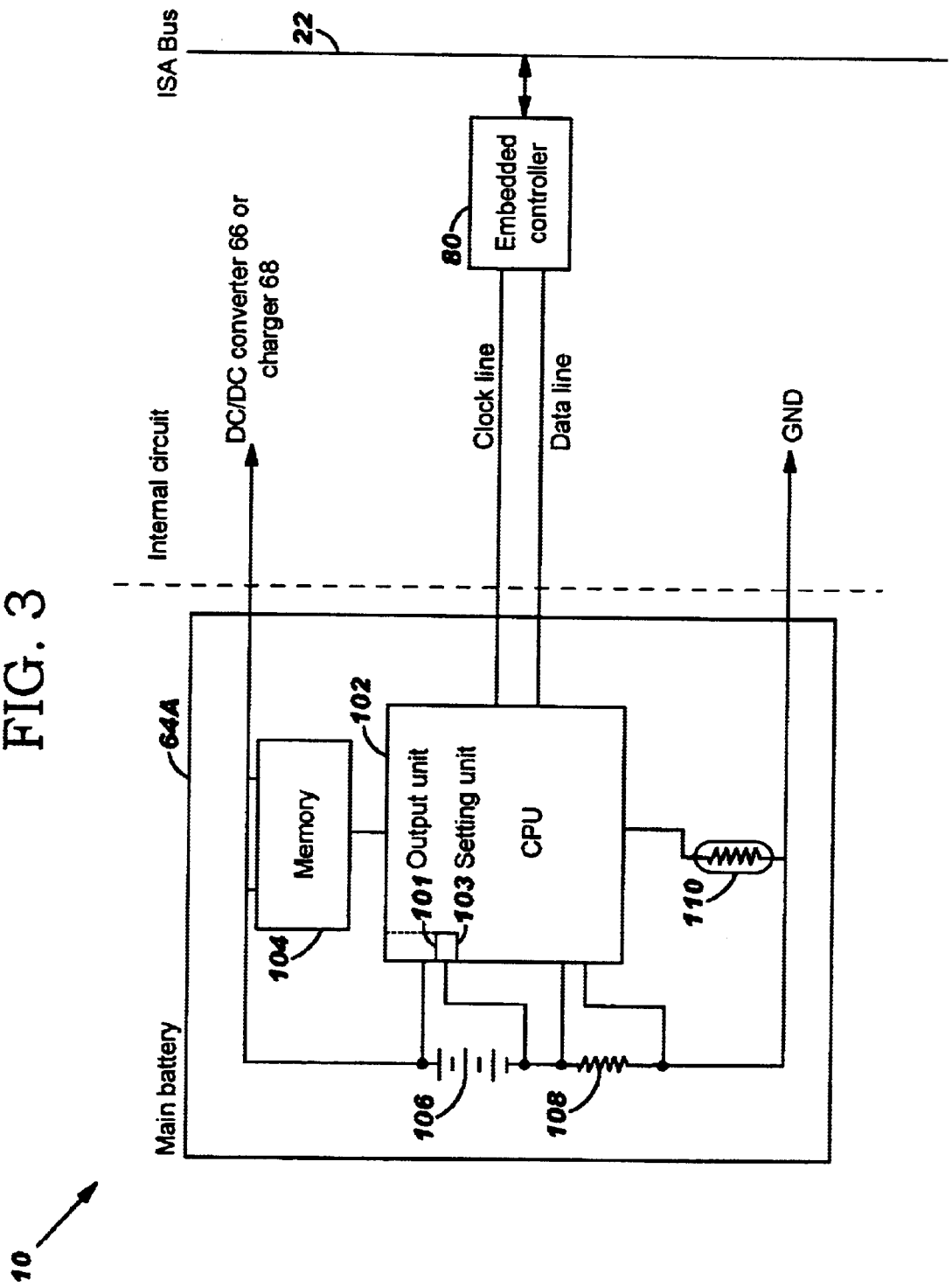
FIG. 3 is a block diagram showing a configuration of a main battery of the notebook PC according to a first embodiment, and the connection between the main battery and other components.

FIG. 3 shows the configuration of the main battery 64A and the connection between the main battery 64A and other components. As shown in the same drawing. the main battery 64A related to the first embodiment comprises a CPU 102 in charge of the overall operation of the main battery 64A, an output unit 101, a setting unit 103, a memory 104 for storing various data, a battery 106 formed by connecting in series three lithium-ion batteries having a rating voltage of approximately 4.2 V, a resistor 108 for detecting the discharging current from the battery 106 and the charging current to the battery 106, and a thermistor 110 for detecting the temperature of the battery 106. As the memory 104, nonvolatile memories which are readable and writable, such as EPROM, EEPROM, and flash EEPROM, can be used in addition to a nonvolatile RAM that is readable and writable. Further, the CPU 102 has an I/O (data input/output) function, an A-D converter (Analog to Digital Converter) function, a communication function, etc. in addition to a processor function.

It is configured that the positive electrode of the battery 106 is controlled by an embedded controller 80 so as to be selectively connected to either the input terminal of a DC/DC converter 66 included in the internal circuit of the computer system 10 (the component other than the main battery 64A and the second battery 64B) or the output terminal of the charger 68. Further, the negative electrode of the battery 106 is grounded in the internal circuit of the computer system 10 through the resistor 108.

On the other hand, the positive and negative electrodes of the battery 106 are connected to the CPU 102, and the CPU 102 can detect the voltage of the battery 106. Preferably, the CPU includes an output unit 101 for outputting information showing a charge current value for the battery as a charge demand. Also, preferably, the CPU also includes a setting unit 101 for providing a setting enabling the charge demand to be output Further, both terminals of the resistor 108 are connected to the CPU 102, and the CPU 102 can detect the magnitude of the discharging current from the battery 106 to the DC/DC converter 66 as well is the magnitude of the charging current from the charger 68 to the battery 106.

Further, the terminal of the resistor 108 on the internal circuit side is connected to the CPU 102 through the thermistor 110, and the CPU 102 can detect the temperature of the battery 106. Furthermore, the memory 104 is connected to the CPU 102, which can write and read various data to/from the memory 104.

Further, the CPU 102 is connected to the embedded controller 80 through clock and data lines, and the CPU 102 sends and receives various information between the embedded controller 80.

Although not shown, the second battery 64B is also configured in a fashion similar to the main battery 64A shown in FIG. 3, and each portion of the second battery 64B is connected to each portion of the internal circuit in a manner similar to the same drawing.

Further, in the computer system 10 related to this embodiment, there is provided a battery pack storage (not shown), in which the main battery 64A and the second battery 64B are removably mounted. Further, the main battery 64A and the second battery 64B are connected to the respective portions of the embedded controller 80 of the internal circuit while mounted in the battery pack storage.

Referring to FIG. 4, the contents of the memory 104 related to this embodiment are described. As shown in the same drawing, in the memory 104, there exist predefined areas for storing data indicating, for instance, the "manufacturer name," "shipping date," "serial number," "bar code number," "battery name," "battery type," "rating capacity," "rating voltage," "charging current," and "remaining capacity" of the battery, respectively, and each data is stored in the corresponding area by the manufacturer when the battery is shipped. In the example shown in the same drawing, for instance, 'IBM' is stored as the manufacturer name and '2000/08/20' is stored as the shipping date at the shipping time. The "charging current" according to the present invention is an area for storing the charging current value corresponding to the type of the battery 106, and in this embodiment, 2600 mA is stored as default, but this value is changed by the CPU 102 as needed. Further, for the "remaining capacity," the same data as the "rating capacity" is stored by the manufacturer as a default value when the battery is shipped.

The main battery 64A and the second battery 64B related to this embodiment are based on the smart battery specification as described above, and the command sets as shown in Table 1 are prepared by way of one example.

TABLE 1

| Function | Code | Access (r/w) | Data |
| --- | --- | --- | --- |
| Manufacturer name | 0 × 20 | r | Character string |
| Shipping date | 0 × 1b | r | Integer without sign |
| Serial number | 0 × 1c | r | Numeric |
| Battery type | 0 × 22 | r | Character string |
| Rating capacity | 0 × 18 | r | mAH or 10 mWH |
| Rating voltage | 0 × 19 | r | mV |
| Charging current | 0 × 14 | r | mA |
| Remaining capacity | 0 × 0f | r | mAH or 10 mWH |
| Charge mode setting | 0 × 34 | r/w | Bit value |

From Table 1, for instance, as to the "manufacturer name," only r (read) is permitted, and the manufacturer name can be read out from the memory 104 when "0×20" is sent as a command to the CPU 102 of the main battery 64A or the second battery 64B by the embedded controller 80.

Further, as for the "remaining capacity," only r (read) is allowed, and the remaining capacity of the battery 106 can be read out from the memory 104 when "0×0f" is sent as a command to the CPU 102 of the main battery 64A or the second battery 64B by the embedded controller 80.

Further, for the "charging current," only r (read) is allowed, and the charging current value for the battery 106 can be read out from the memory 104 when "0×14" is sent as a command to the CPU 102 of the main battery 64A and the second battery 64B by the embedded controller 80.

Further, for the "charge mode setting" particularly according to the present invention, r (read) and w (write) are allowed, and to set the charge mode, "0×3f write hex 'charge mode'" is sent as a command to the CPU 102 of the main battery 64A or the second battery 64B. In this embodiment, the setting of '0' in bit 0 as "charge mode" means the switching to the normal mode for carrying out the normal charge operation, while the setting of '1' in bit 0 as the "charge mode" means the switching to the preservation mode for carrying out a charge operation suitable for preservation.

In addition, the command for the "charge mode" in this embodiment uses one of the five optional commands prepared in the smart battery specification.

The main battery 64A and the second battery 64B correspond to the power supply apparatus of the present invention, the battery 106 corresponds to the battery of the present invention, the CPU 102 corresponds to the charge demanding means of the present invention, the embedded controller 80 corresponds to the control means of the present invention, and the charger 68 corresponds to the charger of the present invention.

To configure the computer system 10, many other electric circuits than shown in FIGS. 1 and 3 are required. However, these are well known to those skilled in the art, and they do not constitute the gist of the present invention, so the description of them is omitted in this specification. Further, to avoid confusion in the drawings, only part of the connections between the respective hardware blocks is shown.

Figure 5:
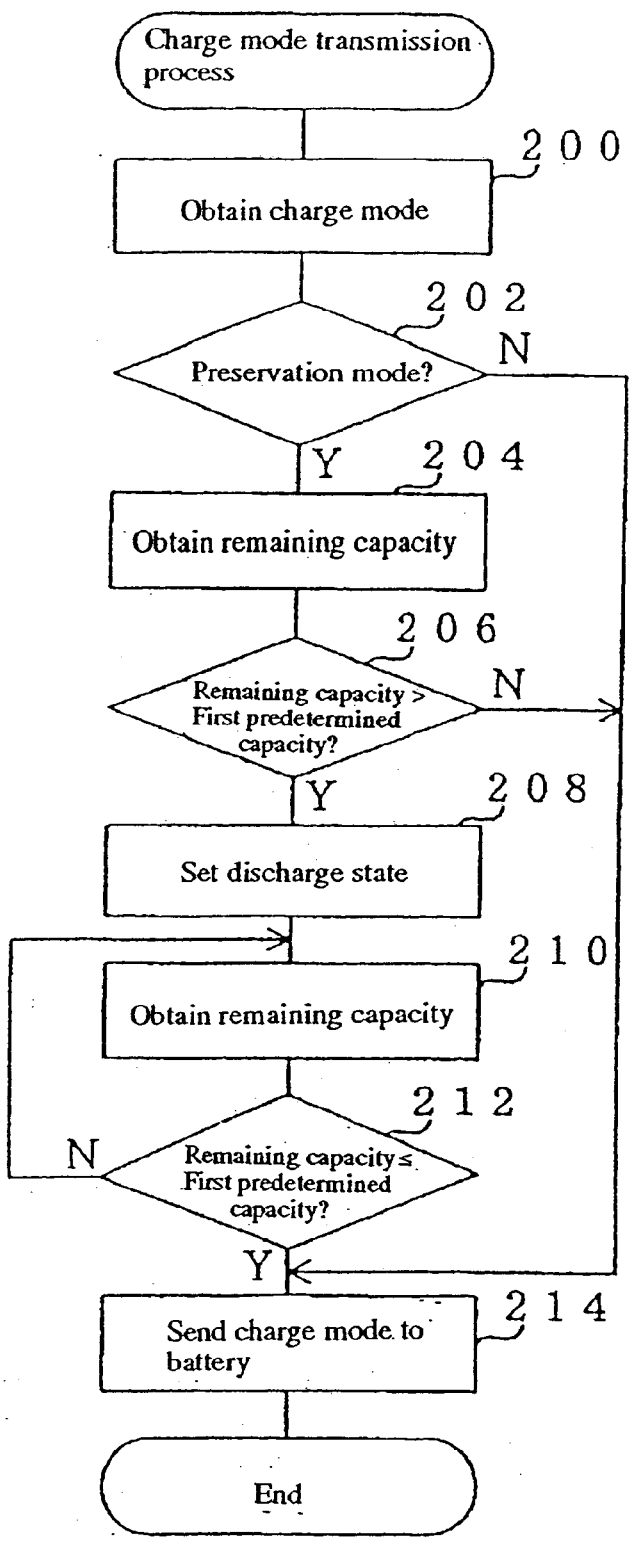
FIG. 5 is a flowchart showing the flow of a charge mode transmission process executed in an embedded controller of the computer system according to an embodiment of the present invention.
Figure 8:
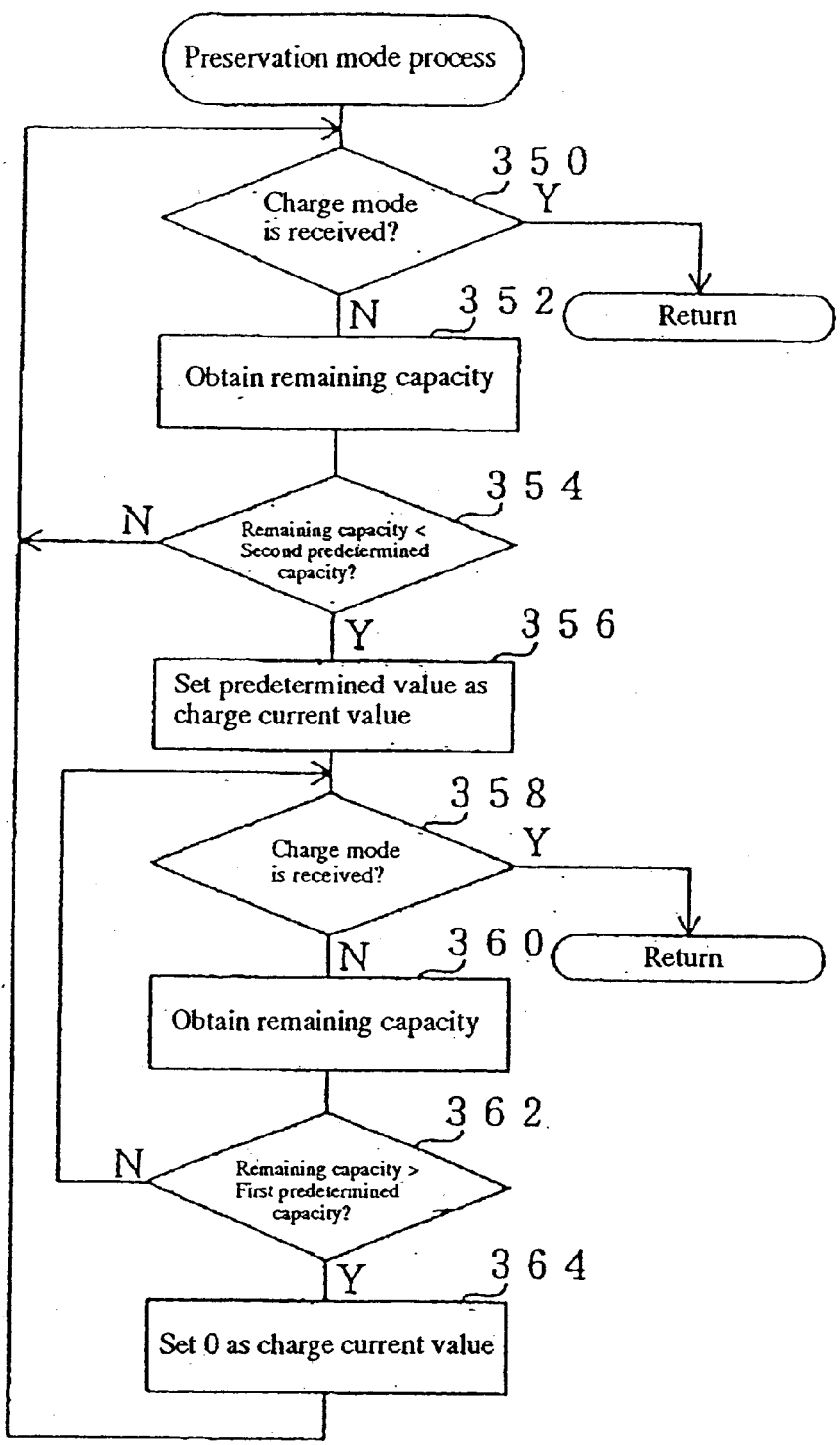
FIG. 8 is a flowchart showing a flow of a preservation mode executed in the CPU of the main battery and second battery according to an embodiment of the present invention.
Figure 9:
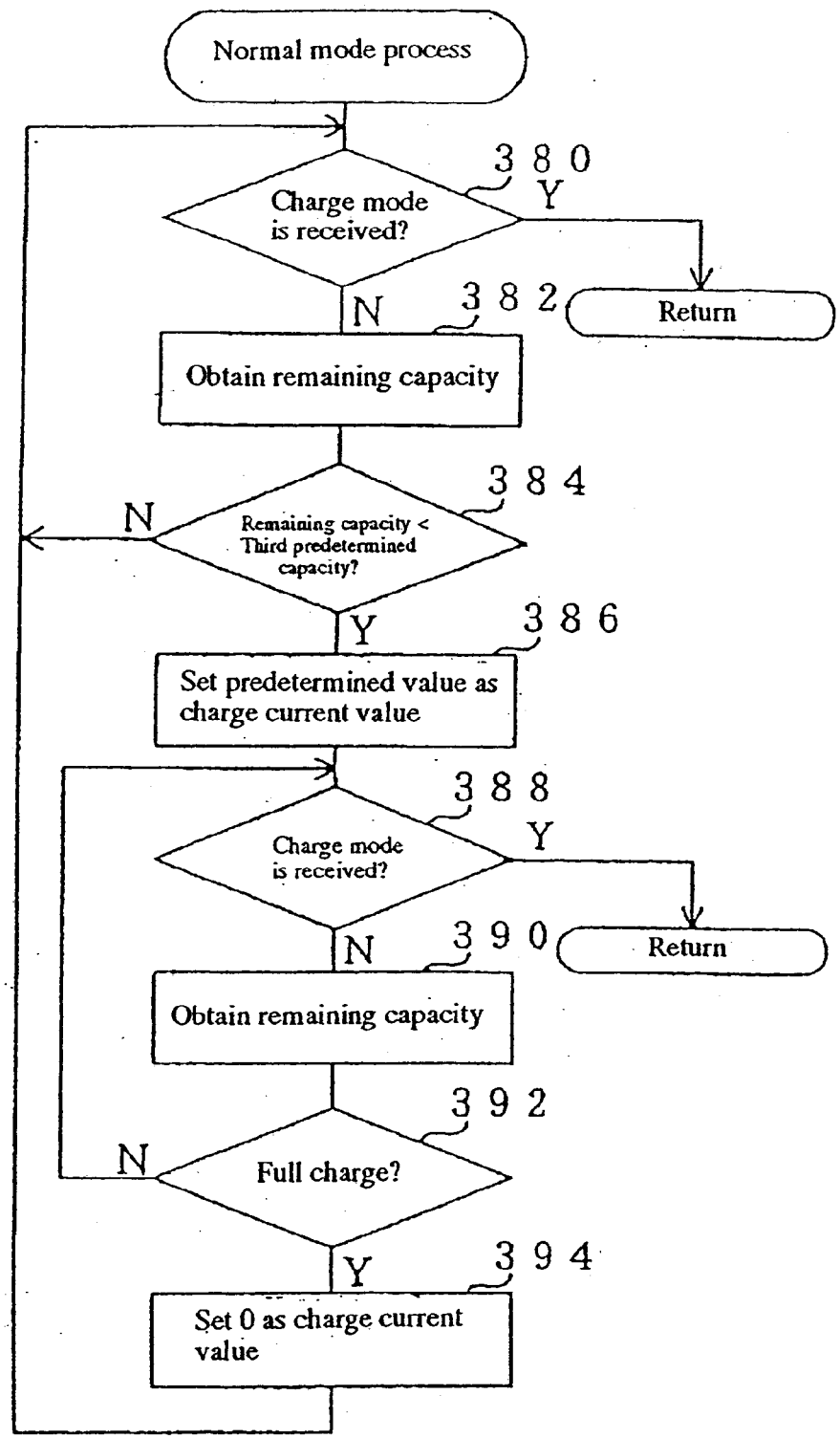
FIG. 9 is a flowchart showing a flow of a normal mode process executed in the CPU of the main battery and second battery according to an embodiment of the present invention.

Now, referring to FIGS. 5 to 9, the operation of the charging of the main battery 64A is described. FIG. 5 is a flowchart showing the flow of the charge mode transmission process that is executed in the embedded controller 80 when the user or the like uses a utility program to set a charge mode. Further, FIG. 6 is a flowchart showing the flow of the charge control process that is executed in the embedded controller 80 when the main battery 64A and the second battery 64B are charged. Furthermore, FIG. 7 is a flowchart showing the flow of the battery internal process that is always executed by the CPU 102 included in the main battery 64A and the second battery 64B, and FIGS. 8 and 9 are flowcharts showing the preservation mode process and the normal mode process which are executed in the battery internal process, respectively. Further, the CPU 102 included in each of the main battery 64A and the second battery 64B also carries out a process in which the remaining capacity of the battery 106 is obtained based on the discharge amount obtained by accumulating the value of the current flowing through the resistor 108, and the remaining capacity is periodically written to the memory 104 at an address corresponding to "remaining capacity." Moreover, the description is made on the assumption that the AC adapter 62 is connected to computer system 10.

First, referring to FIG. 5, the charge mode transmission process executed by the embedded controller 80 shall be described.

In step 200 in the same drawing, the charge mode, which was set by the user or the like using a utility program, is obtained, and in the next step 202, it is determined whether or not the obtained charge mode is the preservation mode, and if it is determined to be the preservation mode (the determination is positive), the process goes to step 204 where the remaining capacity of the battery 106 in the main battery 64A is obtained. At this point, the embedded controller 80 sends "0×0f" as a command to the CPU 102 of the main battery 64A. This allows the embedded controller 80 to acquire a value indicating the remaining capacity of the battery 106 from the memory 104.

When the remaining capacity of the main battery 64A is obtained, then in the next step 206, it is determined whether or not the obtained remaining capacity is larger than a first to predetermined capacity indicating the upper limit of the preservation capacity suitable for preservation in compliance with the type of the battery 106 (in this embodiment, a capacity the proportion of which to the full-charge capacity of the battery 106 corresponds to 80%), and if larger (the determination is positive), the process advances to step 208, where by making the switch to connect the positive electrode of the battery 106 to the input terminal of the DC/DC converter 66, a state is set in which discharging can be made from the battery 106 to the DC/DC converter 66 (hereinafter referred to as "discharging state").

In the next step 210, the remaining capacity of the battery 106 in the main battery 64A is obtained in a manner similar to the above step 204, and in the next step 212, it is determined whether or not the obtained remaining capacity is equal to or lower than the first predetermined capacity; if it is not equal to or lower than the first predetermined capacity (the determination is negative), the process returns to the above step 210, and when it becomes equal to or lower than the first predetermined capacity (the determination becomes positive), the process goes to step 214.

If it is determined in the above step 202 that the charge mode is not the preservation mode (negative determination), the process advances to step 214 without carrying out the processing in the steps 204 to 212. Further, if it is determined in the above step 206 that the remaining capacity is not larger than the first predetermined capacity (negative determination), the process goes to step 214 without carrying out the processing in the above steps 208 to 212.

In accordance with the processing in the above steps 202 to 212, if the preservation mode is set by the user or the like using a utility program, a setting is made to allow discharging from the battery 106 to the DC/DC converter 66 to be performed until the first predetermined capacity is reached when the remaining capacity of the battery 106 in the main battery 64A is larger than the first predetermined capacity, by which the time taken for changing the remaining capacity of the battery 106 to the preservation capacity can be shortened. The processing in step 204 and step 210 corresponds to the reading means of the present invention.

In step 214, after sending information indicating the charge mode obtained in the above step 200 to the CPU 102 of the main battery 64A, the charge mode transmission process is terminated. To send information indicating the charge mode to the CPU 102 in the step 214, it is only needed to send "0×3f write hex 'charge mode'" as a command to the CPU 102 of the main battery 64A, as described above.

Now, referring to FIG. 6, the charge control process executed by the embedded controller 80 shall be described.

In step 250 in the same drawing, by a switching is made so that the positive electrode of the battery 106 is connected to the output terminal of the charger 68, a state is set in which charging is allowed from the charger 68 to the battery 106 (hereinafter referred to as "charging state").

In the next step 252, the value of the charge current of the battery 106 in the main battery 64A is obtained. For this, the embedded controller 80 sends "0×14" as a command to the CPU 102 of the main battery 64A. This allows the embedded controller 80 to obtain the value of the charge current to the battery 106 from the memory 104.

In the next step 254, the charger 68 is controlled so that charging is made with the obtained charge current value, and thereafter the process returns to the step 252. By the process repeating the steps 252 and step 254, charging is carried out with the charge current value set by the CPU 102 of the main battery 64A.

Referring to FIG. 7, the battery internal process executed by the CPU 102 of the main battery 64A shall be described.

In step 300 in the same drawing, "0" (zero) is written into the memory 104 at the address corresponding to "charge current," and in the next step 302, the reception of information indicating the charge mode from the embedded controller 80 is waited for.

If the information indicating the charge mode by the process in step 214 in FIG. 5 is received from the embedded controller 80, then, in the next step 304, it is determined whether or not the received information indicating the charge mode represents the preservation mode, and if it represents the preservation mode (the determination is positive), the process goes to step 306 where, after executing the preservation process shown in FIG. 8, the process returns to the step 304, otherwise (if the determination is negative) the process goes to step 308 to execute the normal mode process shown in FIG. 9, and returns to step 304.

Now, referring to FIG. 8, the preservation mode process shall be described.

In step 350 in the same drawing, it is determined whether or not information indicating the charge mode by step 214 in FIG. 5 is received from the embedded controller 80, and if it is received (the determination is positive), the preservation mode process is terminated and the flow returns to the battery internal process, otherwise (if the determination is negative) the process goes to step 352.

In step 352, the information indicating the remaining capacity of the battery 106 stored in the memory 104 is read out, and in the next step 354, it is determined whether or not the read remaining capacity is smaller than the second predetermined indicating the lower limit of the preservation capacity suitable for preservation corresponding to the type of the battery 106 (in this embodiment, a capacity the proportion of which to the full-charge capacity of the battery 106 corresponds to 50%), and if it is smaller (the determination is positive), the process goes to step 356, otherwise (if the determination is negative) the process returns to the above step 350.

In step 356, the charge current value is set by writing a charge current value suitable for the type of the battery 106 (in this embodiment, 2600 mA) to the memory 104 at the address corresponding to "charge current."

In the next step 358, it is determined whether or not information indicating the charge mode by the process in step 214 in FIG. 5 is received from the embedded controller 80, and if received (the determination is positive), the preservation mode process is terminated and the flow returns to the battery internal process, otherwise (if the determination is negative), the process goes to step 360.

In step 360, the information indicating the remaining capacity of the battery 106 stored in the memory 104 is read out, and in the next step 362, it is determined whether or not the read remaining capacity is larger than the first predetermined capacity, and if larger (the determination is positive), the process goes to step 364, otherwise (if the determination is negative) the process returns to the above step 358.

In step 364, the charging by the charger 68 is stopped by writing "0" (zero) into the memory 104 at the address corresponding to "charge current," and then the process returns to the above step 350.

By this preservation mode process, a series of processing is repeatedly carried out; that is, if the remaining capacity of the battery 106 is lower than the second predetermined capacity, charging is performed with a charge current value suitable for the battery 106 until the remaining capacity of the battery 106 reaches the first predetermined capacity, and the charging is topped after the remaining capacity of the battery 106 reaches the first predetermined capacity. Accordingly, if the "preservation mode" is set by the user or the like using a utility program, the remaining capacity of the battery 106 is maintained in the range from the first predetermined capacity to the second predetermined capacity, which is the preservation capacity range suitable preserving the battery 106.

As aforementioned, the setting of the switch to the preservation mode for the main battery 64A from the embedded controller 80 corresponds to the setting for the setting means of the present invention. Further, the process for the CPU 102 to output the information indicating the charge current value of the battery 106 according to the processing in step 252 of the charge control process executed by the embedded controller 80 corresponds to the output means of the present invention.

Now, referring to FIG. 9, the normal mode process shall be described.

In step 380 in the same drawing, it is determined whether or not information indicating the charge mode by the process in step 214 in FIG. 5 is received from the embedded controller 80, and if received (the determination is positive), the normal mode process is terminated and the flow returns to the battery internal process, otherwise (if the determination is negative) the process goes to step 382.

In step 382, the information indicating the remaining capacity of the battery 106 stored in the memory 104 is read out, and in the next step 384, it is determined whether or not the read remaining capacity is smaller than the full-charge capacity of the battery 106 and smaller than a third predetermined capacity in the vicinity of the full-charge capacity (in this embodiment, a capacity of which proportion to the full-charge capacity of the battery 106 corresponds to 95%), and if smaller 8 the determination is positive), the process goes to step 386, otherwise (if the determination is negative) the process returns to the above step 380.

In step 386, the charge current value is set by writing a charge current value suitable for the type of the battery 106 (in this embodiment, 2600 mA) to the memory 104 at the address corresponding to "charge current."

In the next step 388, it is determined whether or not information indicating the charge mode by the process in the step 214 in FIG. 5 is received, and if received (the determination is positive), the normal mode process is terminated and the flow returns to the battery internal process, otherwise (if the determination is negative) the process goes to step 390.

In step 390, the information indicating the remaining capacity of the battery 106 stored in the memory 104 is read out, and in the next step 392, it is determined whether or not the read remaining capacity has reached the full-charge capacity of the battery 106, and if reached (the determination is positive), the process goes to step 394, otherwise (if the determination is negative) the process returns to the above step 388.

In step 394, the charging by the charger 68 is stopped by writing "0" (zero) into the memory 104 at the address corresponding to "charge current," and then the process returns to the above step 380.

In the normal mode process, if the remaining capacity of the battery 106 is smaller than the third predetermined capacity, a series of process is repeated; that is, charging is carried out with a charge current value suitable for the battery 106 until the remaining capacity of the battery 106 reaches the full-charge capacity, and the charging is stopped after the remaining capacity of the battery 106 has reached the full-charge capacity. Accordingly, if "normal mode" is set by the user or the like using a utility program, the remaining capacity of the battery 106 is maintained in the range from the third predetermined capacity to the full-charge capacity.

Although the above operation is directed to the main battery 64A, a similar operation is also applied to the second battery 64B.

As described above, in the main battery and second battery related to the first embodiment, the remaining capacity of the battery is detected, and a charge current value suitable for charging the battery is output as a charge demand when the remaining capacity becomes lower than a predetermined preservation capacity suitable for preserving the battery, and thus, the main battery and the second battery determine the timing of charging (recharging) for maintaining the preservation capacity corresponding to the battery type by themselves, so that, when a charge demand is output, the battery can be maintained at the preservation capacity suitable for preserving the battery without providing means for determining the battery type, and the battery deterioration in preservation can be suppressed at low cost.

Further, since the main battery and second battery related to the first embodiment is structured so that a setting can be made from the outside to enable a charge demand to be output, a switching to the preservation mode can be made if the user or the like sets the switching to the preservation mode by a utility program.

Further, in the computer system related to the first embodiment, since the charge operation of the battery by the charger is controlled according to the charge demand (charge current value) output from the main battery and the second battery, the battery of the main battery and second battery can be maintained at a preservation capacity suitable for preserving the battery without providing means for determining the battery type, so the battery deterioration in preservation can be suppressed at low cost.

Further, in the computer system related to the first embodiment, since the capacity (remaining capacity) of the battery, which was detected by the main battery and the second battery, is read, and if the read remaining capacity exceeds the preservation capacity suitable for preservation, the battery is discharged to the above preservation capacity before carrying out the charge operation for the battery, so the remaining capacity of the battery can be rapidly reduced to the preservation capacity and the switching to the preservation mode can be made in a short time.

In the above first embodiment, description has been made to provide an example of the switching to the preservation mode based on a setting by the user or the like; in another aspect of the present invention, referred to by way of example as the second embodiment, the present invention is provided for the switching to the preservation mode is made by each battery itself of the main battery and second battery. For the configurations of the main battery 64A and the second battery 64B in the second embodiment, and the configurations other than the connections between each battery and other components, description provided herein is limited as such for the first embodiment is incorporated herein by reference as well.

Figure 10:
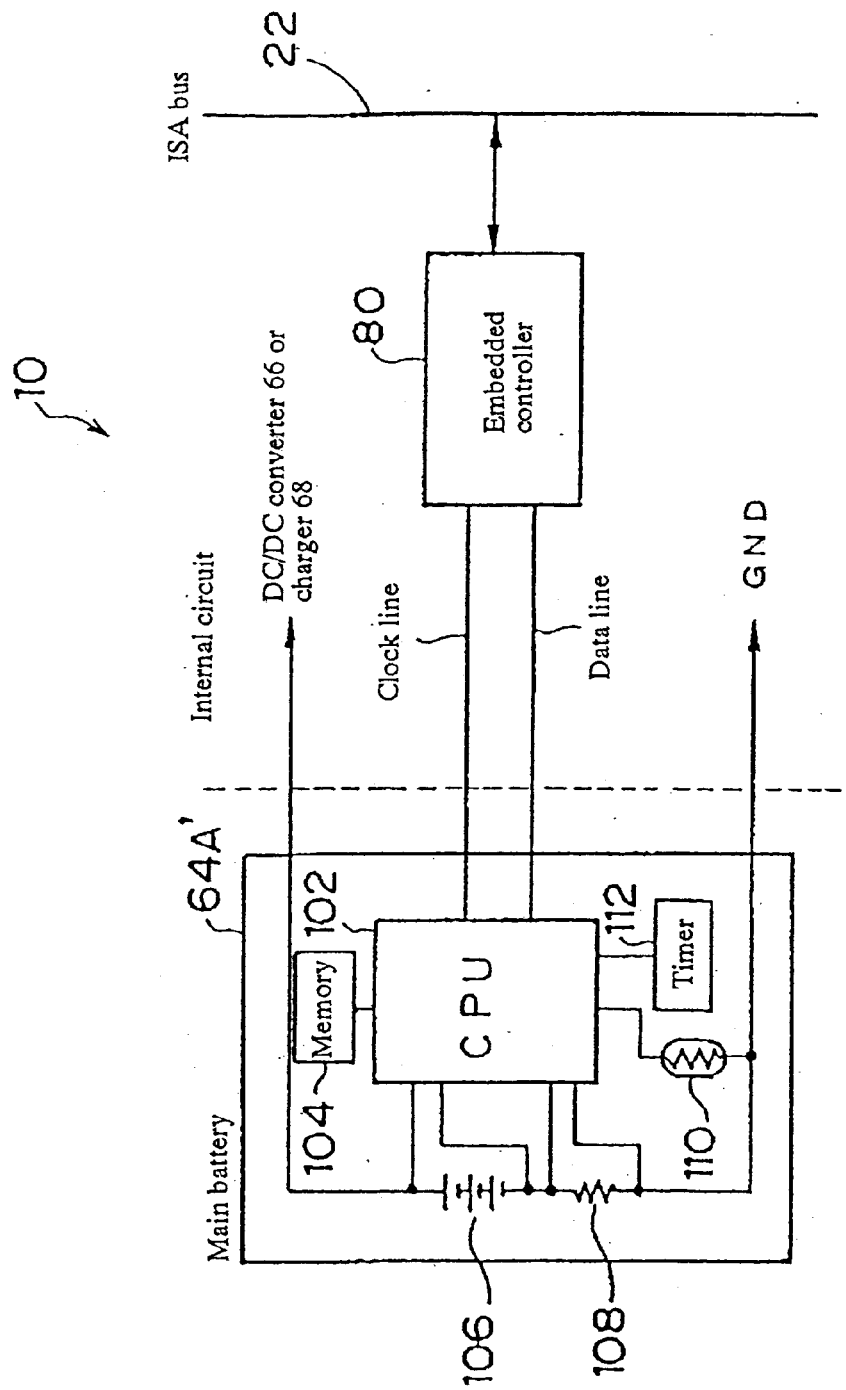
FIG. 10 is a block diagram showing a configuration of the main battery of the notebook PC according to an embodiment of the present invention, and a connection between the main battery and other components.

First, referring to FIG. 10, description is made to the configuration of the main battery 64A' in the second embodiment and to the connections between the main battery 64A' and other components. To the portions of FIG. 10 which are similar to FIG. 3, the same symbols and use as was previously presented in FIG. 3 are also assigned.

As shown in FIG. 10, the main battery 64A' in the second embodiment is different from the main battery 64A in the first embodiment in the point that it is provided with a timer 112 connected to the CPU 102.

Figure 11:
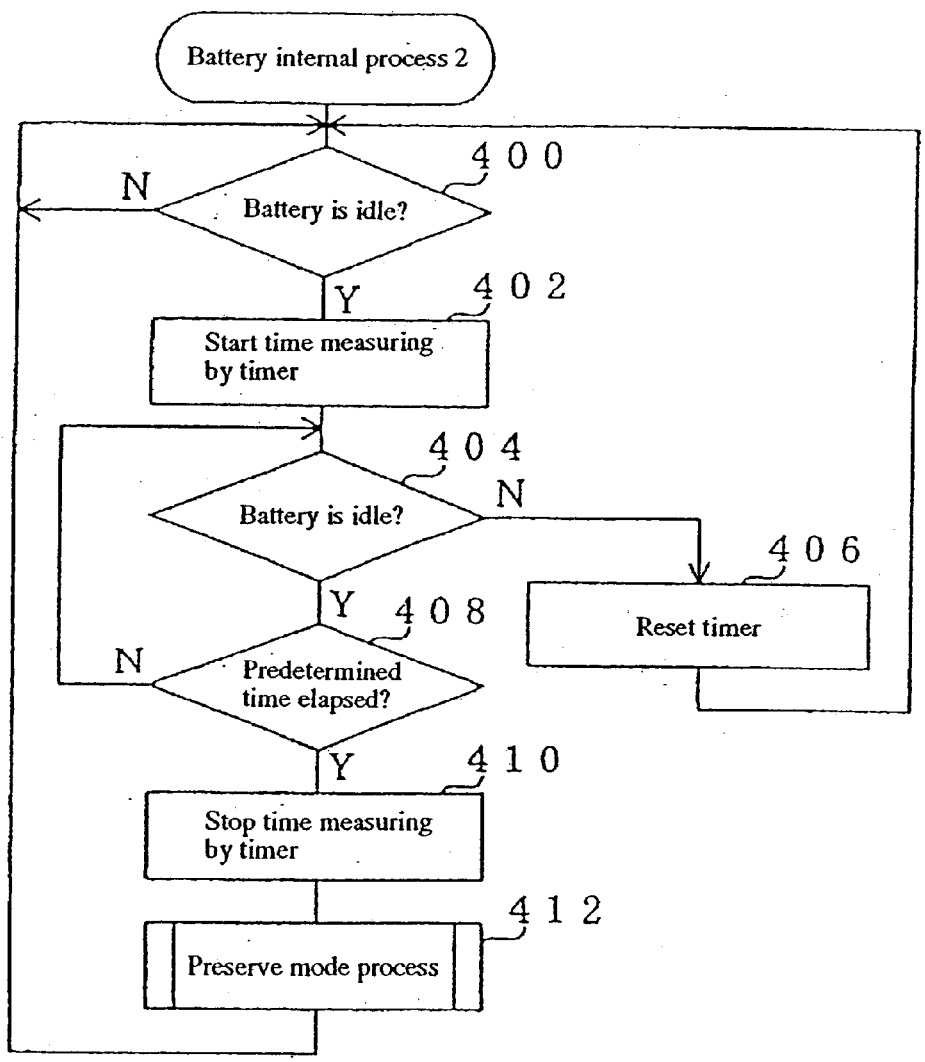
FIG. 11 is a flowchart showing the flow of the battery internal process 2 executed in the CPU of the main battery and second battery according to an embodiment of the present invention.
Figure 12:
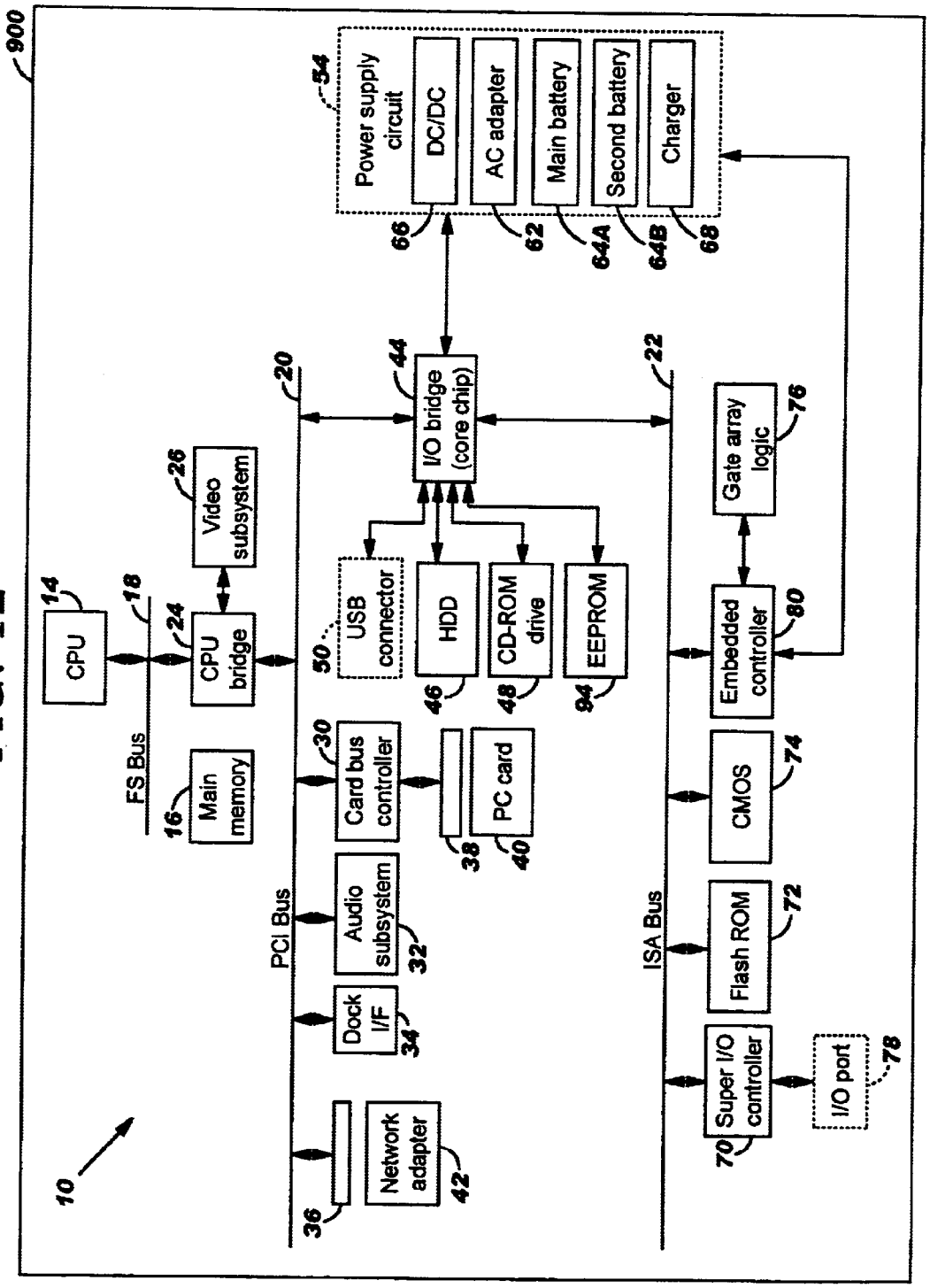
FIG. 12 is a diagram depicting the present invention in an automobile.

Now, referring to FIG. 11, description shall be made to the battery internal process 2 executed in the CPU 102 of the main battery 64A' in the second embodiment.

In step 400 in the same drawing, it is determined whether or not the main battery 64' is in a state in which charging is not made from the battery 106 of the main battery 64' to the DC/DC converter 66 (hereinafter referred to as "idle state"), and if it is not in the idle state (the determination is negative), that is, if charging is made to DC/DC converter 66, the process enters a standby condition, and when it is determined to be in the idle state (the determination is positive), the process goes to step 402. Further, in this embodiment, the determination as to the idle state is made by detecting the value of the discharge current from the battery 106, and determining that it is in the idle state if the discharge current value is smaller than a value that enables the deeming of power being supplied to the DC/DC converter 66.

In step 402, time measuring by the timer 112 is started, and in the next step 404, it is determined in a manner similar to the above step 400 whether or not the main battery 64' is in the idle state, and if it is not in the idle state (the determination is negative), the process goes to step 406 to reset the timer 112, and then returns to the above step 400.

If it is determined in the above step 404 that the main battery 64' is in the idle state (the determination is positive), the process goes to step 408 to determine whether or not the time measurement by the timer 112 has reached a predetermined time (in this embodiment, time corresponding to one month), and if not reached (the determination is negative), the process returns to the above step 404, and goes to step 410 when reached (the determination is positive).

In step 410, the preservation mode process as shown in the first embodiment (also refer to FIG. 8) is executed, and thereafter the process returns to the above step 400.

Although the above operation is directed to the main battery 64', a similar operation is also applied in the second battery. The processing in steps 400 and 404 correspond to the detecting means of the present invention, and the processing in the steps 402, 406, 408, and 410 correspond to the measuring means of the present invention.

As described above, in the main battery and second battery related to the second embodiment, an effect similar to the main battery and second battery in the first embodiment can be produced, and a charge demand for the remaining battery capacity lower than the preservation capacity is output only when the idle state becomes equal to or longer than a predetermined time, and thus, the main battery and second battery automatically make the switching to the preservation mode by themselves, so the battery deterioration in preservation can reliably be suppressed even if the AC adapter is pulled out from the computer system.

In the first embodiment, description has been made to the case in which the preservation mode or the normal mode is selectively set by the user or the like, while in the second embodiment description has been made to the case in which the battery itself automatically makes the switching to the preservation mode, but the present invention is not so limited, and for instance, in one aspect, it is also possible that three types of modes, "automatic to determination mode," "preservation mode," and "normal mode," can be set by a utility program, and default is set to be the automatic determination mode to provide an operation similar to the second embodiment. This allows automatic switching to the preservation mode even if a setting change to the preservation mode is made by the user.

Further, in each embodiment above, description has been made to the case in which the is power supply apparatus and charge control apparatus according to the present invention are applied to a computer system, but the present invention is not so limited, and it can also applied to various equipment using a secondary battery, for instance, household electric appliances, electric automobiles, etc. Also in this case, an effect similar to each embodiment above can be produced.

Further, in each embodiment aforementioned, description has been made to the case in which lithium-ion battery is applied as the battery of the present invention, but the present invention is not limited to this, and for instance, in one aspect, nickel-hydrogen battery, nickel-cadmium battery, lithium-polymer batter or the like may be used. Also in this case, an effect similar to each embodiment above can be produced.

Further, in each embodiment, description has been provided in which the power supply apparatus of the present invention is applied to an intelligent battery based on the smart battery specification, but the present invention is not so limited, and it can be applied to an intelligent battery which is not based on the smart battery specification, for instance, of a unique type. Also in this case, an effect similar to each embodiment above can be produced.

Further, in each embodiment, description has been made to the case in which the charge current value of the battery is output as the charge demand according to the present invention, but the present invention is not so limited, and for instance, in one aspect, it is possible that a signal indicating execution/non-execution of the charging of a battery is output. Also in this case, an effect similar to each embodiment above can be produced.

Further, in each embodiment above, description has been made to the case in which, as the remaining battery capacity according to the present invention, the remaining capacity obtained based on the discharge amount obtained by accumulating the value of the current flowing through the resistor 108 is directly applied, but the present invention is not so limited, and the voltage value of the battery which increases or decreases according to the remaining capacity may be applied. In one aspect of this, for instance, the voltage value of the battery is maintained in the range of approximately 11.7 V to 11.0 V instead of the remaining battery capacity being maintained in the range of approximately 80% to 50%. Also in this case, an effect similar to each embodiment above can be produced.

Further, in each embodiment above, description has been made to the case in which the charge demand according to the present invention is output according to the reception of a command from the embedded controller 80, but the present invention is not so limited, and in one aspect, it is also possible that the main battery 64A and second battery 64B outputs a charge demand to the embedded controller 80 by themselves when they detect that the remaining capacity of the stored battery has become lower than the preservation capacity.

Also in this case, an effect similar to each embodiment above can be produced. In addition, the charge control method according to each embodiment described above can be formed into a program (hereinafter referred to as "charge control program") using various programming languages.

This charge control program can be recorded on a machine-readable recording medium. As the recording medium, it is possible to use memory units which are mounted on a computer system, such as ROM (Read Only Memory), EEPROM (Electrically Erasable Programmable Read Only Memory), and flash EEPROM, portable recording media such as floppy disk (FD), CD-ROM (read only memory using compact disk), and MO (magneto-optic) disk, or external storage devices provided on server computers or the like connected to a network.

The charge control program recorded on the recording medium is taken into the computer in the following manner. If the recording medium having the above charge control program recorded thereon is a portable recording medium, it is loaded on a drive, and the charge control program recorded on the portable recording medium is read in. The read charge control program is stored in the main memory.

If the recording medium is an external storage device on a network, the charge control program recorded on the external storage device is downloaded through the network connection device. The downloaded charge control program is stored in the main memory.

As described above, in accordance with the power supply apparatus according to the present invention, the remaining charge capacity of the battery is detected, and a charge demand is output when the remaining capacity becomes lower than a predetermined preservation capacity suitable for preserving the battery, and the power supply apparatus itself determines the timing of charging (recharging) for maintaining the preservation capacity according to the battery, so the battery can be maintained at the preservation capacity suitable for maintaining the battery only by charging the battery from the outside when the charge demand is output, without providing means for determining the battery type, thereby providing an excellent effect that the battery deterioration in preservation can be suppressed at low cost.

Further, in accordance with the charge control apparatus and charge control method according to the present invention, since the battery charge operation by the charger is controlled in response to a charge demand output from the power supply apparatus according to the present invention, the battery of the power supply apparatus can be maintained at the preservation capacity suitable for preserving the battery without providing means for determining the battery type, thereby providing an excellent effect that the battery deterioration in preservation can be suppressed at low cost.

Further, in accordance with the computer according to the present invention, since the battery charge operation by the charger is controlled in response to a charge demand output from the power supply apparatus according to the present invention, the battery of the power supply apparatus can be maintained at the preservation capacity suitable for preserving the battery without providing means for determining the battery type, thereby providing an excellent effect that the battery deterioration in preservation can be suppressed at low cost.

Further, in accordance with the electric automobile according to the present invention, since at least one of the power supply apparatus and charge control apparatus according to the present invention is provided, an effect similar to the charge control apparatus according to the present invention can be produced.

What is claimed is:

1. A power supply apparatus, comprising:
a rechargeable battery; and a charge demanding unit for detecting remaining capacity of said battery, and outputting a charge demand when said remaining capacity becomes lower than a predetermined preservation capacity suitable for preserving said battery, wherein said charge demanding unit further comprises a detecting unit for detecting a use state of said battery and a measuring unit for measuring duration of idle state of said battery, and outputs said charge demand when said remaining capacity is lower than the predetermined preservation capacity and said idle state is longer than a predetermined time.

2. The power supply apparatus according to claim 1, wherein said charge demanding unit further comprises an output unit for outputting information showing a charge current value for said battery as said charge demand.

3. The power supply apparatus according to claim 1, wherein said charge demanding unit further comprises a settings means for providing settings information enabling said charge demand to be output, and outputs said charge demand when said remaining capacity is lower than said preservation capacity and the setting is provided by said setting unit for enabling said charge demand to be output.

4. The power supply apparatus according to claim 1, wherein said charge demanding unit further comprises a settings means for providing settings information enabling said charge demand to be output, and outputs said charge demand when said remaining capacity is lower than said predetermined preservation capacity and said settings information is provided by said settings means for enabling said charge demand to be output.

5. A charge control apparatus, for controlling charging of a battery provided in a power supply apparatus having a rechargeable battery and a charge demanding unit for detecting remaining capacity of said battery, and for outputting a charge demand when said remaining capacity becomes lower than a predetermined preservation capacity suitable for preserving said battery, comprising: a charger for charging said battery; and a controller for controlling the charge operation of said battery by said charger in response to said charge demand from said power supply apparatus, wherein said charge demanding unit comprises a detecting unit for detecting a use state of said battery, and a measuring unit for measuring duration of idle state of said battery, and outputs said charge demand when said remaining capacity is lower than said predetermined preservation capacity and said idle state is longer than a predetermined time.

6. The charge control apparatus according to claim 5, wherein said controller further comprises a reading unit for reading said detected remaining capacity of the battery, and discharges said battery to said predetermined preservation capacity before said charge operation when the read remaining capacity exceeds said predetermined preservation capacity.

7. A charge control method for controlling charging of a battery provided in a power supply apparatus, comprising a control step of controlling a charge operation of said battery by a charger in response to a charge demand from said power supply apparatus, wherein said charge demand is outputted when detected remaining capacity of battery is determined to be lower than a predetermined preservation capacity and an idle state of said battery is determined to be longer than a predetermined time.

8. The charge control method according to claim 7, further comprising a step of reading said detected remaining capacity of battery, wherein said control step initiates a discharge of said battery to said predetermined preservation capacity prior to said charge operation if the remaining battery capacity is read by said reading step to exceed said predetermined preservation capacity.

9. A machine-readable recording medium on which a program is recorded for controlling charging of a battery provided in a power supply apparatus, said machine-readable recording medium having recorded thereon a program including a control step of controlling a charge operation of said battery by a charger in response to a charge demand from said power supply apparatus, wherein said charge demand is outputted when detected remaining capacity of battery is determined to be lower than a predetermined preservation capacity and an idle state of said battery is determined to be longer than a predetermined time.

10. The machine-readable recording medium according to claim 9, further comprising a reading step of reading said detected remaining battery capacity of a battery, wherein said control step initiates a discharge of said battery to said predetermined preservation capacity prior to said charge operation if the remaining battery capacity is read by said reading step to exceed said predetermined preservation capacity.

11. A computer, comprising a CPU, a memory, a display, and an input device, interconnected by a bus, and a power supply apparatus comprising a rechargeable battery and a charge demanding unit for detecting remaining capacity of said battery, and outputting a charge demand when said remaining capacity becomes lower than a predetermined preservation capacity suitable for preserving said battery, wherein said memory is a recording medium on which a program is recorded for controlling charging of the battery provided in the power supply apparatus, said machine-readable recording medium having recorded thereon the program including a control step of controlling the charge operation of said battery by a charger in response to the charge demand from said power supply apparatus, wherein said charge demand is outputted when remaining capacity of battery is determined to be lower than a predetermined preservation capacity and an idle state of said battery is determined to be longer than a predetermined time.

12. A computer, comprising a CPU, a memory, a display, an input device, a network connection device, which are interconnected by a bus, and a power supply apparatus comprising a rechargeable battery and a charge demanding unit for detecting remaining capacity of said battery, and outputting a charge demand when said remaining capacity becomes lower than a predetermined preservation capacity suitable for preserving said battery, wherein said memory is a recording medium on which a program is recorded for controlling charging of the battery provided in the power supply apparatus, said machine-readable recording medium having recorded thereon the program including a control step of controlling the charge operation of said battery by a charger in response to the charge demand from said power supply apparatus;, wherein a server computer is arranged for remote access on a network to which said network connection device is connected is the recording medium, and wherein said charge demand is outputted when remaining capacity of battery is determined to be lower than a predetermined preservation capacity and an idle state of said battery is determined to be longer than a predetermined time.

13. An electric vehicle for transport, comprising a power supply apparatus having a rechargeable battery and a charge demanding unit for detecting remaining capacity of said battery, and outputting a charge demand when said remaining capacity becomes lower than a predetermined preservation capacity suitable for preserving said battery, and an idle state of said battery is determined to be longer than a predetermined time.

14. The electric vehicle according to claim 13, wherein the electric vehicle is an automobile.

15. An electric vehicle for transport, comprising a charge control apparatus for controlling charging of a battery provided in a power supply apparatus, having a charger for charging said battery and a controller for controlling a charge operation of said battery by said charger in response to a charge demand from said power supply apparatus, wherein said charge demand is outputted when remaining capacity of battery is determined to be lower than a predetermined preservation capacity and an idle state of said battery is determined to be longer than a predetermined time.

16. The electric vehicle according to claim 15, wherein the electric vehicle is an automobile.

* * * * *